United States Patent
Lagergren et al.

(10) Patent No.: US 7,245,059 B2
(45) Date of Patent: Jul. 17, 2007

(54) METHOD OF EXCITING A PIEZOELECTRIC CRYSTAL

(75) Inventors: Peter John Lagergren, Glen Rose, TX (US); Steven Scott Kazemir, Port Coquitlam (CA)

(73) Assignee: Xtero Datacom Inc., North Vancouver, British Columbia (CA)

( * ) Notice: Subject to any disclaimer, the term of this patent is extended or adjusted under 35 U.S.C. 154(b) by 98 days.

(21) Appl. No.: 11/131,435

(22) Filed: May 16, 2005

(65) Prior Publication Data

US 2005/0275308 A1 Dec. 15, 2005

Related U.S. Application Data

(60) Provisional application No. 60/571,835, filed on May 17, 2004.

(51) Int. Cl.
*H01L 41/09* (2006.01)
(52) U.S. Cl. .................................................. 310/317
(58) Field of Classification Search ................ 310/317, 310/322, 323.01–323.19, 334
See application file for complete search history.

(56) References Cited

U.S. PATENT DOCUMENTS

| 3,985,030 A | 10/1976 | Charlton ........................ 73/290 |
| 4,815,323 A | 3/1989 | Ellinger et al. ................. 73/290 |
| 4,853,694 A | 8/1989 | Tomecek ..................... 340/621 |
| 4,868,797 A * | 9/1989 | Soltz ............................. 367/98 |
| 4,901,245 A | 2/1990 | Olson et al. ................. 364/509 |
| 5,131,271 A | 7/1992 | Haynes et al. ................. 73/290 |
| 5,150,334 A | 9/1992 | Crosby ........................ 367/98 |
| 5,195,058 A | 3/1993 | Simon ........................ 367/87 |
| 5,261,274 A | 11/1993 | Nemirow ...................... 73/149 |
| 5,319,973 A | 6/1994 | Crayton et al. ............... 73/290 |
| 5,335,545 A | 8/1994 | Leszczynski ................. 73/602 |
| 5,511,041 A | 4/1996 | Michalski ..................... 367/99 |
| 5,563,478 A * | 10/1996 | Suganuma ................... 318/116 |
| 5,644,299 A * | 7/1997 | Cruickshank ............... 340/617 |
| 5,697,248 A * | 12/1997 | Brown ...................... 73/290 V |
| 5,755,136 A * | 5/1998 | Getman et al. ........... 73/290 V |
| 5,778,726 A | 7/1998 | Muller et al. ................. 73/290 |
| 5,866,815 A | 2/1999 | Schwald et al. ............. 73/290 |
| 5,991,234 A | 11/1999 | Sejalon et al. ................ 367/13 |
| 6,317,029 B1 | 11/2001 | Fleeter ..................... 340/10.32 |
| 6,396,819 B1 | 5/2002 | Fleeter et al. ............... 370/320 |
| 6,397,656 B1 | 6/2002 | Yamaguchi et al. ......... 73/1.82 |
| 6,412,344 B1 | 7/2002 | Danicich et al. ............. 73/290 |
| 6,481,627 B1 | 11/2002 | Guerreri ................ 235/472.01 |
| 2005/0192727 A1* | 9/2005 | Shostak et al. ............... 701/37 |
| 2006/0144139 A1* | 7/2006 | Miyagawa ................ 73/290 V |

* cited by examiner

*Primary Examiner*—Thomas M. Dougherty
(74) *Attorney, Agent, or Firm*—John R. Thompson; Stoel Rives LLP (57) ABSTRACT

The invention describes the use of an electrical pulse that is a single square wave to excite a piezoelectric crystal. This pulse is applied alternately to either side of the crystal at twice the nominal resonant frequency of the crystal. This method provides a significant increase in net drive power to the crystal without the need to provide a sine wave excitation of plus and minus voltage to the crystal.

20 Claims, 7 Drawing Sheets

METHOD OF EXCITING A PIEZOELECTRIC CRYSTAL

REFERENCES CITED

This application is based on, claims priority to, and includes the information in provisional application Ser. No. 60/571,835 filed on May 17, 2004 and which is incorporated herein by reference.

BACKGROUND OF THE INVENTION

The present invention relates to a system for ultrasonically exciting the a piezoelectric crystal used in an ultrasonic ranging device.

In North America and throughout the world, there are substantial numbers of propane fuel tanks installed outside residential and commercial premises to provide energy for heating, cooling and cooking. These tanks can range in size from ones which have a relatively small capacity (e.g. 50 gallons) to ones which have a relatively large capacity (e.g. 1000 gallons or more). Often, the propane fuel is sold by a propane distributor to its customers under a contract where the distributor provides the customer with the tank in return for the exclusive right to supply the customer with the fuel.

Accordingly, there is a need in the propane industry for a direct method of monitoring customer inventory. In this respect, there are existing fuel tank mounted mechanical gauges which can be installed to provide an approximate indication of inventory. However, the readings they provide are typically quite unreliable (e.g. an error range of plus or minus 10% to 20%). An option that would provide improved accuracy would be to install on each tank a totalizing flow meter like that used by a fuel truck when delivering fuel to a tank, or comparable to that used by utilities that supply electricity, natural gas or water to utility customers. Then, the total volume of fuel removed from the tank then could be recorded and regularly compared with the volume when the tank was filled. However, apart from the cost of installing and maintaining such precision flow meters, the customers of a propane distributor are often located in non-urban areas. The distance between such customers can be too large to justify the repetitive manual collection of usage data.

It is known to sense the level of liquid contained in a tank utilizing sonic measurement techniques; typically sonic or ultrasonic measurements made with the use of a piezoelectric crystal. If the level of liquid is known and the geometry of the tank is known, then the volume of liquid in the tank can be calculated based upon the measured level. However, when the liquid in question is propane and the tank in question is a propane tank, problems arise. One problem is the adequacy of acoustic coupling between the ultrasonic transducer and the fuel tank. If the coupling is poor, then it may not be possible to obtain a measurement, or any measurement made may be unreliable. Another problem is the voltage levels which are generated by the transducer. If relatively high voltages are involved, then regulatory approval may be difficult or impossible to obtain. Dominating any solution to such problems is the question of cost. A solution which enables direct measurement but which requires a costly installation on each fuel tank of each customer is an impractical solution.

BRIEF SUMMARY OF THE INVENTION

In accordance with the present invention, there is provided a new and improved method of exciting a piezoelectric crystal used in an ultrasonic fuel level monitoring system for sensing the level of liquid in a liquid fuel tank. The system includes an ultrasonic transducer unit externally mountable on the bottom of the tank and a control unit operably connectable to the transducer unit. In a preferred embodiment where the tank is a propane tank, the control unit is preferably mounted atop the tank and is connected to the transducer unit by an electrical cable.

The transducer unit includes a piezoelectric crystal ("piezo") transducer, a piezo driver circuit, and preferably a temperature sensor. In cases where the propane tank is a steel wall propane tank, it has been found that the transducer unit advantageously further includes an aluminum disk normally interposed between the piezo and the tank wall to provide improved acoustic coupling.

In response to command signals from the control unit, the piezo driver circuit causes the piezo to transmit ultrasonic pulse trains having a controlled pulse frequency through the wall of the tank (and the aluminum disk if included), and to listen for return echoes from the surface of liquid in the tank. Echo return signal information is sent back to the control unit from the transducer unit.

The controlled pulse frequency determined by the control unit is an adaptively determined pulse frequency. More particularly, it has been found that the pulse frequency at which suitably strong echo return signals can be detected may not only differ from the resonant frequency of the piezo but also can depend upon the acoustical impedance of the "stack" (viz. the piezo, aluminum disk (if any), and tank wall thicknesses combined), the acoustical impedance of the bonding agent used to secure the transducer unit to the tank, and ambient temperature. It is possible that other factors may have an influential effect. All of these considerations and possible unknowns recommend against a fixed pulse frequency and in favor of a system where the pulse frequency is frequency agile, and is adaptively determined depending upon echo return signal strengths that can be obtained over a swept range of pulse frequencies.

The process of transmitting ultrasonic pulse trains into a fuel tank and listening for return echoes is referred to herein as "pinging" the tank. As is well understood by those skilled in the art, the time that it takes for a transmitted signal to the reach the liquid surface and to be echoed back (viz. time-of-flight) will correspond to the liquid level. With knowledge of the tank geometry, a measurement of the volume of fuel in the tank then can be calculated.

The temperature sensor mentioned above is desirable because, as is also well understood by those skilled in the art, tank geometry will vary with increasing or decreasing temperatures. Thus, the time-of-flight measured at one temperature may be the same as the time-of-flight measured at another temperature. Yet, the actual volume of fuel in the tank at the two temperatures may differ. With knowledge of the temperature and tank geometry as a function of temperature, a more accurate measurement of the volume of fuel in the tank can be calculated at any given temperature. When the transducer unit includes a temperature sensor, a signal corresponding to temperature is sent back to the control unit from the transducer unit.

This invention describes a novel way to provide the electrical pulses required to excite the piezo crystal. The piezo driver circuit which forms part of the transducer unit advantageously comprises an analog switching circuit which has the effect of powering the piezo with either a single pulse, the voltage of which is twice that of the voltage source, or the same driving power as with alternating plus or minus voltages, the absolute values of which correspond to that of the voltage source.

This technique significantly increases the net power delivered by the piezo to the fuel tank without having either a high voltage source in the transducer unit or the control unit, and without requiring a transformer to boost the source voltage.

DETAILED DESCRIPTION OF THE INVENTION

Figure 1:
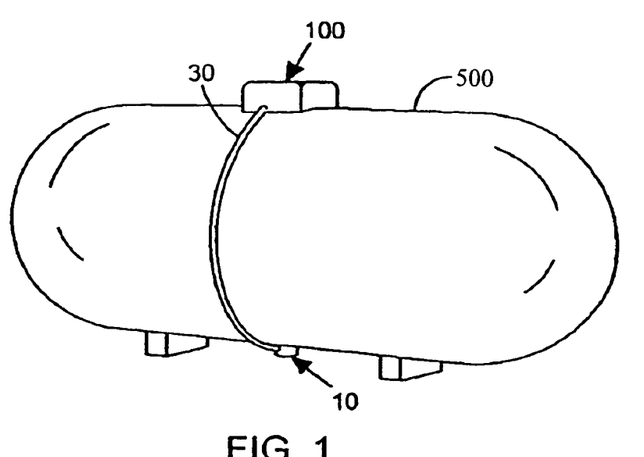
FIG. 1 is a perspective view illustrating mechanical aspects of an ultrasonic fuel level monitoring system in accordance with the present invention when mounted to a propane fuel tank.

Referring to FIG. 1, there is shown an ultrasonic fuel level monitoring system for sensing the level of liquid in a propane fuel tank 500. The system includes an ultrasonic transducer unit generally designated 10 externally mounted on the bottom of the tank and a control unit generally designated 100 externally mounted on the top of the tank. Control unit 100 is operably connected to transducer unit 10 by electrical cable 30. As described below in more detail, the transducer unit transmits ultrasonic signals through the wall of tank 500 and listens for return echoes from the surface of propane liquid (not depicted) contained in the tank. The control unit directs the operation of the transducer unit and collects time-of-flight data and temperature data from the transducer unit.

Figure 2:
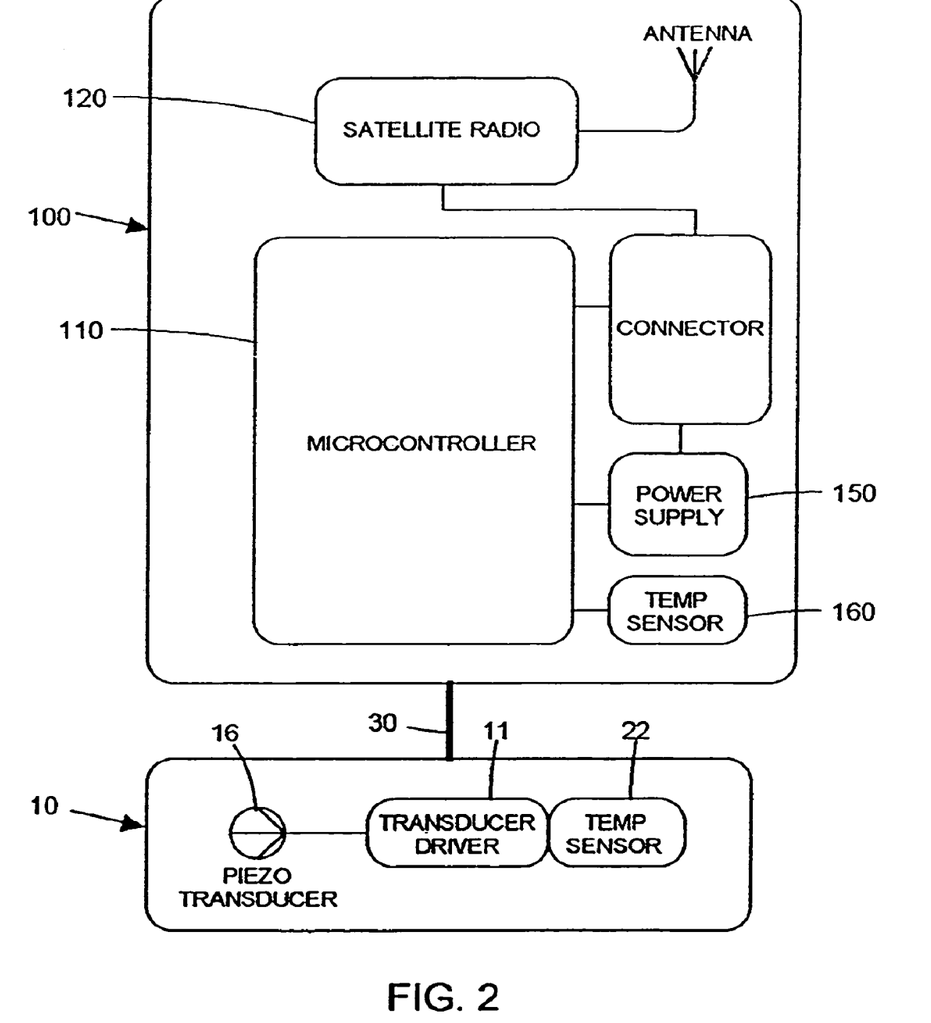
FIG. 2 is a high level block diagram of the monitoring system shown in FIG. 1.

As shown in FIG. 2, transducer unit 10 comprises a transducer driver 11, a piezoelectric crystal transducer or piezo 16, and a temperature sensor 22. Temperature sensor 22 is used to obtain a measurement of the temperature of tank 500 which is desirable in order to adjust readings taken for accuracy (e.g. within plus or minus 2%). Control unit 100 comprises a very low power microcontroller 110 connected to a satellite radio 120, a battery power supply 150 and an ambient temperature sensor 160. To minimize size and cost, radio 120 is preferably a simplex radio capable of transmitting but not receiving.

Figure 4:
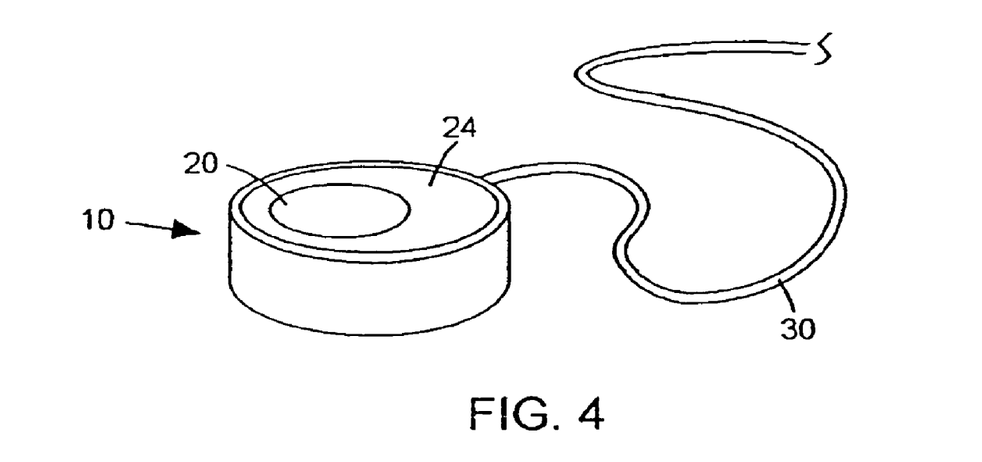
FIG. 4 is a perspective view illustrating mechanical aspects of the transducer unit forming part of the monitoring system shown in FIG. 1.
Figure 5:
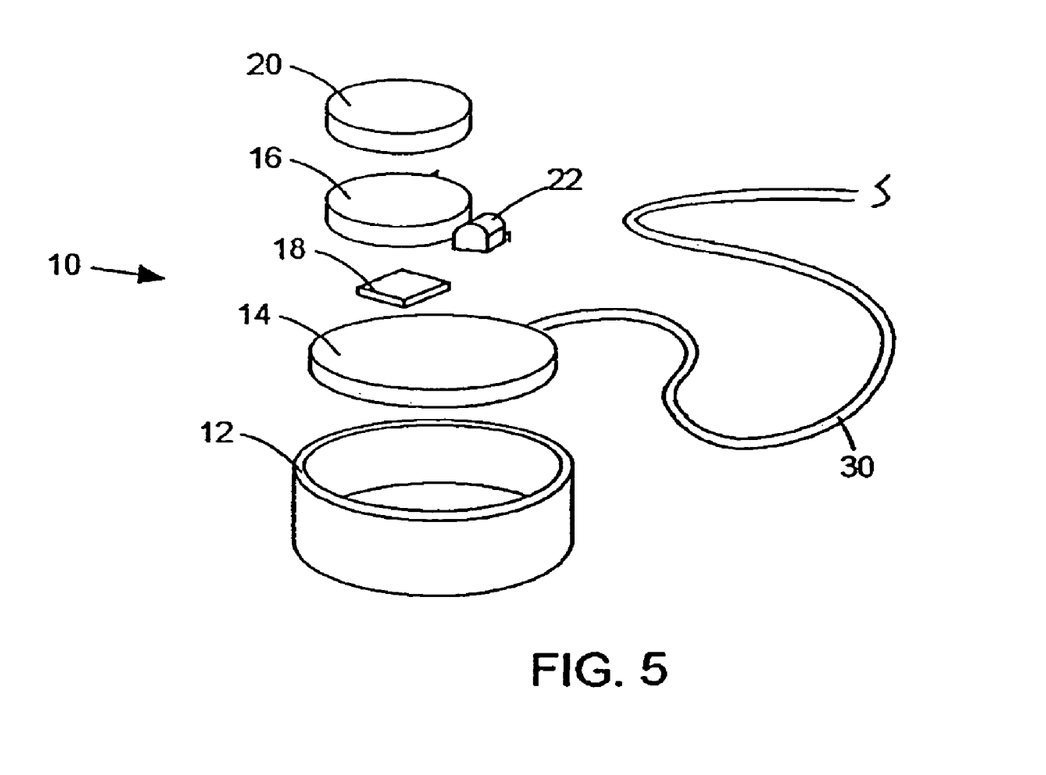
FIG. 5 is an exploded perspective of the transducer shown in FIG. 4.

As shown in FIGS. 4-5, transducer unit 10 additionally comprises a housing 12, a printed circuit board (PCB) 14 for holding transducer circuitry which is normally mounted to the bottom of the board, a foam pad cushion set on PCB 14 and 18 atop which piezo 16 normally rests while connected to the board, and an aluminum acoustic coupling disk 20. Temperature sensor 22 is mounted atop PCB 14. Disk 20 is bonded (viz. with epoxy) directly atop piezo 16. All components are secured within housing 12 by potting compound 24 with the upper surface of disk 20 left exposed for contact with the bottom outer wall of tank 500 when unit 10 is bonded to the tank.

Figures 6A, 6D:
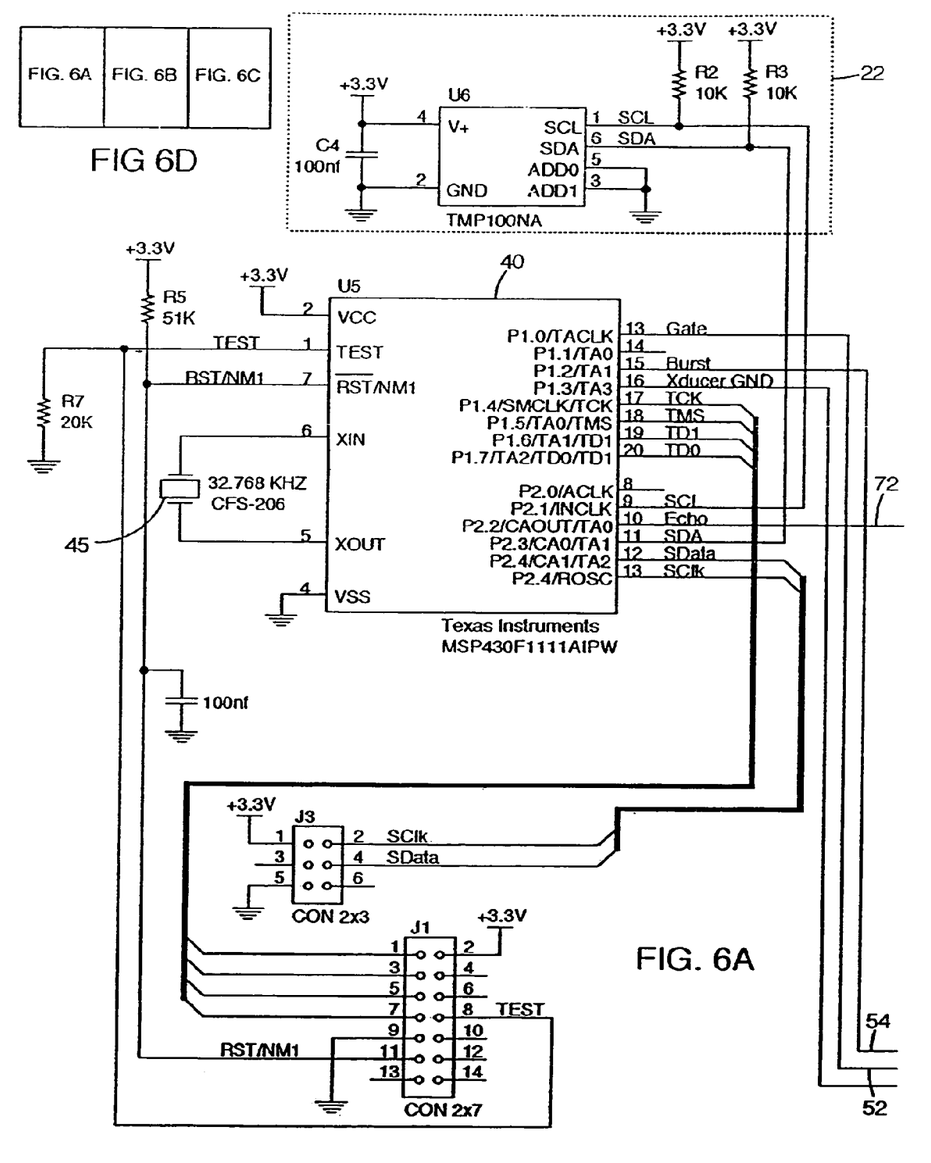
FIG. 6 consisting of FIGS. 6A to 6C assembled in the manner shown in FIG. 6D is a diagram of circuitry the within transducer unit shown in FIG. 2.
Figure 6B:
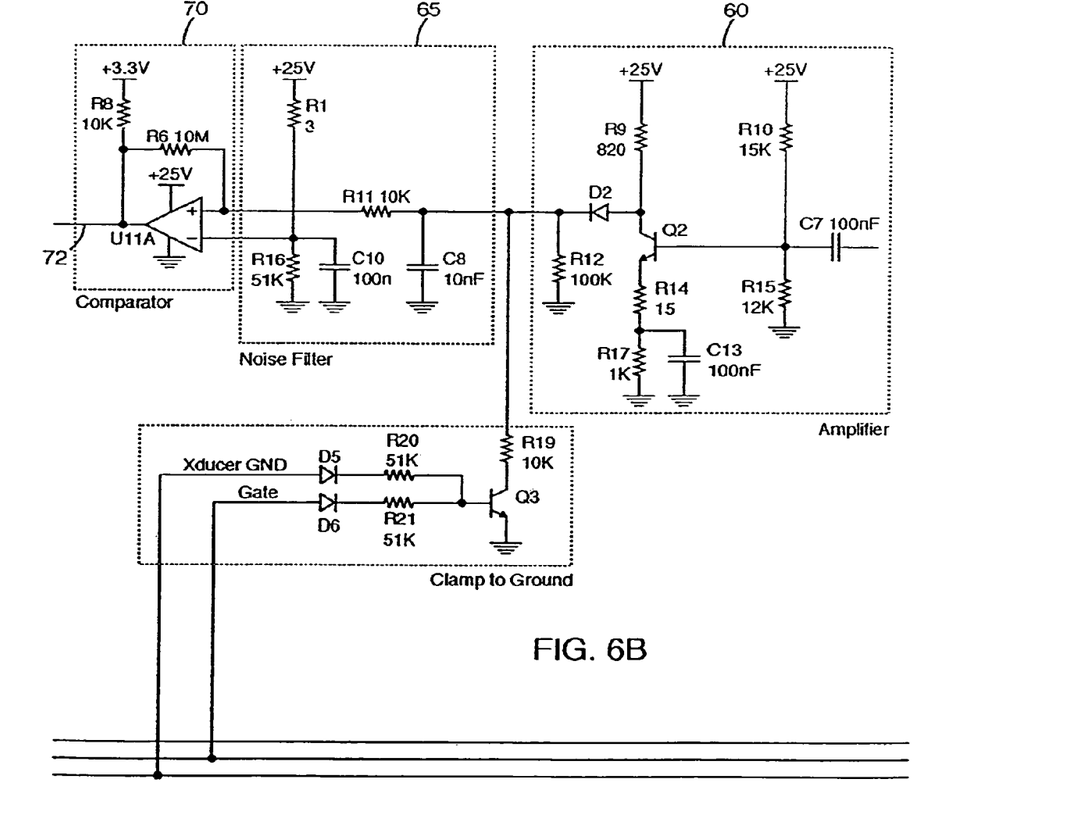
Figure 6C:
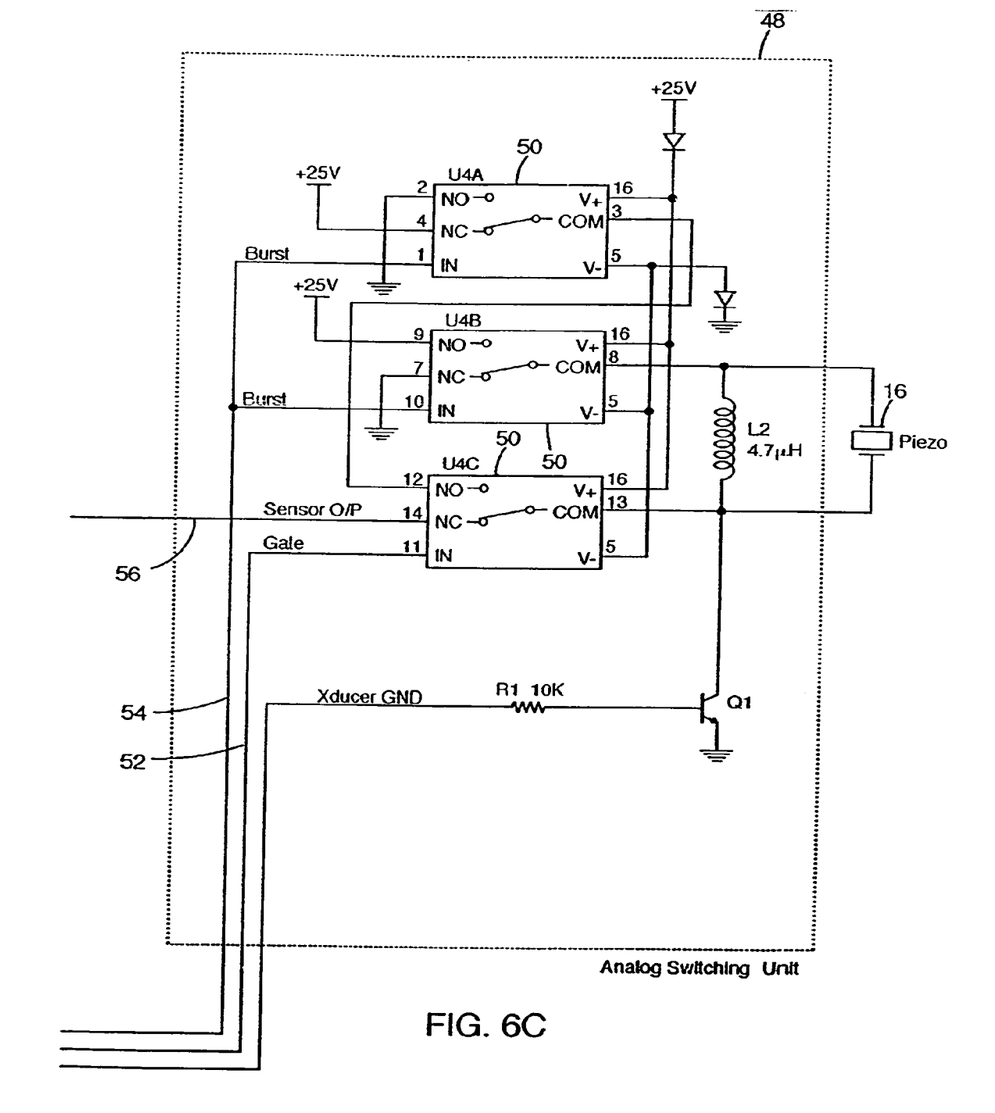
Figure 7:
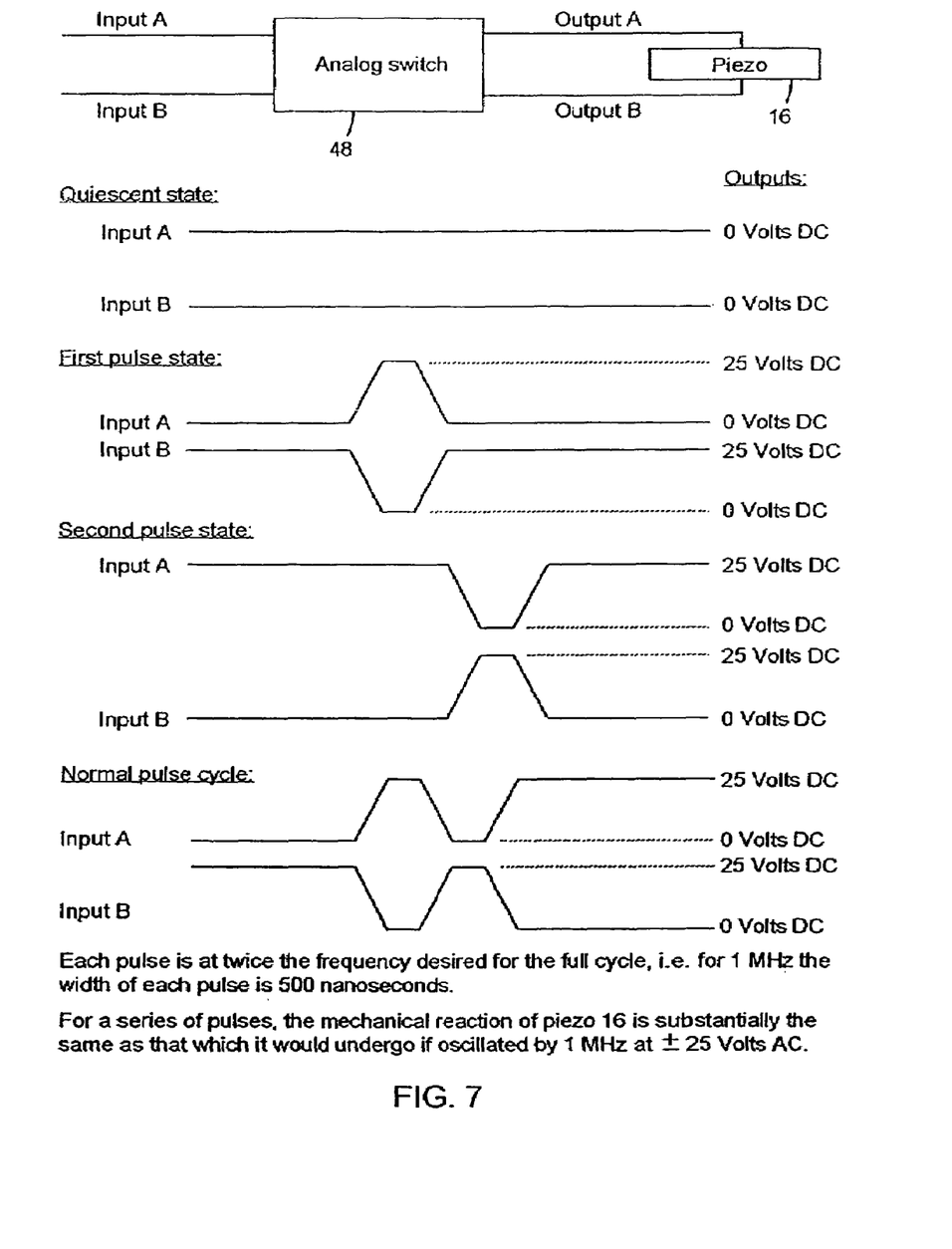
FIG. 7 is a set of waveforms illustrating the pulsing of a piezoelectric crystal in accordance with the present invention.

Referring to FIG. 6, transducer unit 10 includes a very low power microcontroller 40 operatively coupled to temperature sensor 22 and to an analog switching unit 48, the latter of which comprises three analog switches 50 which receive gate and burst signals on lines 52, 54 from the microcontroller and pulse piezo 16 in the manner shown and described in FIG. 7. Echo return signals received by piezo 16 are output from switching unit 48 on line 56. Such return signals are amplified by amplifier 60, filtered by noise filter 64 and level detected with comparator 70. The output of comparator 70 on line 72 is provided as an input back to microcontroller 40.

Figure 3:
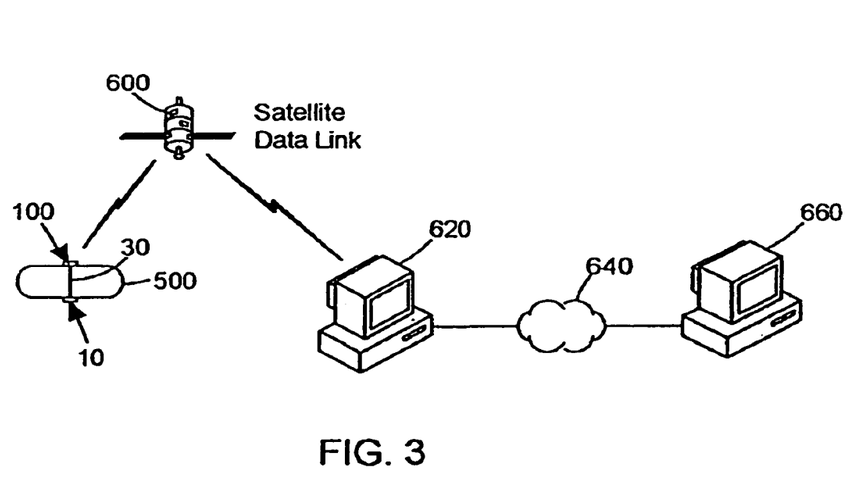
FIG. 3 shows a working environment for the propane tank and the monitoring system shown in FIG. 1.

FIG. 3 illustrates a working environment wherein data collected by control unit 100 from transducer unit 10, including time-of-flight data and temperature data, is transmitted by radio from control unit 100 via a satellite data link 600 to a computer 620. Computer 620 includes a computer readable storage medium which receives the data input and, together with previously stored information on tank geometry and dimensions and a suitable computer program product, processes the received data to calculate a measure of the volume of fuel in tank 500. The calculated measure is also stored in the storage medium and may be read-out and displayed by computer 620. Via a further data link (e.g. the internet 640), the calculated measure may also be read-out and displayed from computer 620 by a second computer 660.

It will be appreciated that the foregoing working environment is one which can be expanded to a system where a centralized server computer (e.g. computer 620) receives data transmissions via satellite from numerous control units 100 each monitoring a different propane tank (e.g. tank 500). The propane tanks may be located at widely dispersed geographic locations. Some may be serviced by the same propane distributor and others may be serviced by different propane distributors. Each distributor could utilize its own computer 660 to receive data from computer 620 concerning the customers it services.

In more detail, transducer unit 10 is silent and unpowered during all phases of operation except when a tank reading is being requested. Control unit 100 is timed to wake up at intervals (e.g. every 16 seconds) to determine the time of day, and to compare that time with a sensing and transmission schedule programmed in microcontroller 110. If the system is not scheduled to either "ping" tank 500 or to transmit measurement information via satellite radio 120, then unit 100 goes back to sleep.

If the system determines that a sensed reading is required, then transducer unit 10 is powered on by the control unit activating a 3.3 volt power supply that feeds power to the transducer unit. The transducer unit then uses a very small, very low current drain, circuitry to generate 25 volts for use in the drive circuit for piezo 16 (viz. analog switching circuit 48).

When transducer unit 10 wakes up, it is programmed to listen for a set of commands sent to it by control unit 100 over a synchronous serial data link including cable 30. Control unit 100 will tell transducer unit 10 a lower frequency of piezo oscillation, an upper frequency of piezo oscillation, the number of pings to perform and the frequency difference between each sequence of pings.

A ping is generated by microcontroller 40 flipping two signals from 0 to 3.3 volts and back to 0 volts at a frequency rate that is determined by command from control unit 100. A pulse train of 36 pulses set for each ping has been found to be suitable, but it of course will be understood that a differing number of pulses also may be found suitable. Each of the 3.3 volt pulses is used to command the switching of the 25 volt power source into piezo 16 via analog switches 50. As indicated in FIG. 7, the switching is done in such a way that each of the two sides of piezo 16 are pulsed alternately with a 25 volt spike. Advantageously, this has the equivalent effect of powering the piezo with either a 50 volt single pulse at the resonant frequency, or with alternating plus and minus 25 volt pulses.

This technique significantly increases the net power delivered by transducer unit 10 to tank 500 without having either a high voltage source in the transducer unit or requiring a transformer to boost the voltage. There is also a significant savings in parts by using a square wave directly produced by microcontroller 40 instead of generating a sine wave to drive piezo 16.

The invention claimed is:

1. A method of exciting a piezoelectrical crystal in an ultrasonic ranging device that generates an ultrasonic signal and receives an echo of the ultrasonic signal to determine a fuel level, comprising:
    generating a drive voltage;
    placing opposing sides of the piezoelectrical crystal in electrical communication with the drive voltage;
    applying a first pulse of substantially the same voltage as the drive voltage to a first opposing side and simultaneously applying zero voltage to a second opposing side; and
    applying a second pulse of substantially the same voltage as the drive voltage and substantially the same duration as the first pulse to the second opposing side and simultaneously applying zero voltage to the first opposing side to thereby alternatively pulse the opposing sides.

2. The method of claim 1, wherein the drive voltage is a direct current voltage.

3. The method of claim 1, wherein the first and second pulses are approximately square waves.

4. The method of claim 1, wherein the first and second pulses are applied at twice a nominal resonant frequency of the piezoelectrical crystal.

5. A method of exciting a piezoelectrical crystal in an ultrasonic ranging device that generates an ultrasonic signal and receives an echo of the ultrasonic signal to determine a fuel level, comprising:
    generating a drive voltage;
    placing opposing sides of the piezoelectrical crystal in electrical communication with the drive voltage;
    applying a first series of pulses of substantially the same voltage as the drive voltage to a first opposing side and simultaneously applying zero voltage to a second opposing side; and
    applying a second series of pulses of substantially the same voltage as the drive voltage to the second opposing side and simultaneously applying zero voltage to the first opposing side, wherein the second series of pulses alternates with the first series of pulses.

6. The method of claim 5, wherein the drive voltage is a direct current voltage.

7. The method of claim 5, wherein each pulse in the first and second series of pulses is approximately a square wave.

8. The method of claim 5, wherein the first and second pulses are applied at twice a nominal resonant frequency of the piezoelectrical crystal.

9. The method of claim 5, wherein each pulse in the first and second series has substantially the same duration.

10. An ultrasonic ranging device to generate an ultrasonic signal and receive an echo of the ultrasonic signal to determine a fuel level, comprising:
    a drive circuit to generate a drive voltage;
    a switch in electrical communication with the drive circuit to receive the drive voltage;
    a piezoelectric crystal having first and second opposing sides in electrical communication with the switch; and
    wherein the switch is configured to apply a first pulse of substantially the same voltage as the drive voltage to the first opposing side and simultaneously applying zero voltage to a second opposing side, and configured to apply a second pulse of substantially the same voltage as the drive voltage and substantially the same duration as the first pulse to the second opposing side and simultaneously apply zero voltage to the first opposing side to thereby alternatively pulse the opposing sides.

11. The ultrasonic ranging device of claim 10, wherein the drive voltage is a direct current voltage.

12. The ultrasonic ranging device of claim 10, wherein the first and second pulses are approximately square waves.

13. The ultrasonic ranging device of claim 10, wherein the first and second pulses are applied at twice a nominal resonant frequency of the piezoelectrical crystal.

14. The ultrasonic ranging device of claim 10, wherein the switch is an analog switch.

15. An ultrasonic ranging device to generate an ultrasonic signal and receive an echo of the ultrasonic signal to determine a fuel level, comprising:
    a drive circuit to generate a drive voltage;
    a switch in electrical communication with the drive circuit to receive the drive voltage;
    a piezoelectric crystal having first and second opposing sides in electrical communication with the switch; and
    wherein the switch is configured to apply a first series of pulses of substantially the same voltage as the drive voltage to the first opposing side and simultaneously apply zero voltage to a second opposing side, and to apply a second series of pulses of substantially the same voltage as the drive voltage to the second opposing side and simultaneously apply zero voltage to the first opposing side, wherein the second series of pulses alternates with the first series of pulses.

16. The ultrasonic ranging device of claim 15, wherein the drive voltage is a direct current voltage.

17. The ultrasonic ranging device of claim 15, wherein each pulse of the first and second series is approximately a square wave.

18. The ultrasonic ranging device of claim 15, wherein the pulses of the first and second series are applied at twice a nominal resonant frequency of the piezoelectrical crystal.

19. The ultrasonic ranging device of claim 15, wherein the switch is an analog switch.

20. The ultrasonic ranging device of claim 15, wherein each pulse in the first and second series has substantially the same duration.

* * * * *

UNITED STATES PATENT AND TRADEMARK OFFICE
CERTIFICATE OF CORRECTION

| | | |
|---|---|---|
| PATENT NO. | : 7,245,059 B2 | Page 1 of 1 |
| APPLICATION NO. | : 11/131435 | |
| DATED | : July 17, 2007 | |
| INVENTOR(S) | : Peter John Lagergren et al. | |

It is certified that error appears in the above-identified patent and that said Letters Patent is hereby corrected as shown below:

Change the title from "METHOD OF EXCITING A PIEZOELECTRIC CRYSTAL" to --NOVEL METHOD OF EXCITING A PIEZOELECTRIC CRYSTAL--

In the "References Cited" change "Muller" to --Müller--.

Column 1, Line 14 reads, ". . . exciting the a piezoelectric crystal . . ." which should read --. . . exciting a piezoelectric crystal . . .--

Column 1, Line 44 reads, ". . . It is known to sense the level . . ." which should read --. . . It is known how to sense the level . . .--

Column 1, Line 45 reads, ". . . measurement techniques; typically . . ." which should read --. . . measurement techniques: typically . . .--

Column 2, Lines 43-44 read, ". . . signal to the reach the liquid surface . . ." which should read --. . . signal to reach the liquid surface . . .--

Column 3, Lines 26-27 read, ". . . circuitry the within transducer unit . . ." which should read --. . . circuitry within the transducer unit . . .--

Column 5, Line 25, reads, ". . . a drive voltage;" which should read --. . . a drive voltage [[, and]];--

Signed and Sealed this

Twenty-sixth Day of August, 2008

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,245,059 B2 |
| APPLICATION NO. | : 11/131435 |
| DATED | : July 17, 2007 |
| INVENTOR(S) | : Peter John Lagergren et al. |

It is certified that error appears in the above-identified patent and that said Letters Patent is hereby corrected as shown below:

<u>Title Page,</u>
Item [54], Title, the word "NOVEL" (as inserted by the Certificate of Correction issued August 26, 2008) should be deleted and title is to be reinstated to read -- METHOD OF EXCITING A PIEZOELECTRIC CRYSTAL --.

Signed and Sealed this

Twenty-third Day of September, 2008

JON W. DUDAS
*Director of the United States Patent and Trademark Office*